(12) United States Patent
Ueki

(10) Patent No.: US 10,152,456 B2
(45) Date of Patent: Dec. 11, 2018

(54) CORRELATION OPERATION CIRCUIT AND SEMICONDUCTOR DEVICE

(71) Applicant: Renesas Electronics Corporation, Tokyo (JP)

(72) Inventor: Hiroshi Ueki, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/582,865

(22) Filed: May 1, 2017

(65) Prior Publication Data

US 2017/0337158 A1    Nov. 23, 2017

(30) Foreign Application Priority Data

May 23, 2016   (JP) .................................. 2016-102500

(51) Int. Cl.
```
G06F 17/15      (2006.01)
G06F 7/544      (2006.01)
G06F 13/42      (2006.01)
G11C 11/419     (2006.01)
```
(52) U.S. Cl.
CPC ............ *G06F 17/15* (2013.01); *G06F 7/5443* (2013.01); *G06F 13/4282* (2013.01); *G11C 11/419* (2013.01)

(58) Field of Classification Search
CPC ..... G06F 17/15; G06F 7/5443; G06F 13/4282
USPC .................................................. 708/501, 523
See application file for complete search history.

(56) References Cited

U.S. PATENT DOCUMENTS 5,644,519 A * 7/1997 Yatim .................... G06F 7/5443
                                                     708/523

FOREIGN PATENT DOCUMENTS

JP           5-282351 A      10/1993

* cited by examiner

*Primary Examiner* — Tan V Mai
(74) *Attorney, Agent, or Firm* — Sughrue Mion, PLLC

(57) ABSTRACT

A correlation operation circuit includes a first SRAM storing a plurality of pieces of detection pattern data, product-sum operators, a second SRAM storing intermediate data, and a comparator. When time series data is sequentially input, the intermediate data of all correlation functions referring to one time series data in a period during which the one time series data is input. When one time series data is input, the product-sum operator multiplies the detection pattern data sequentially read from the first SRAM by the one input time series data. The corresponding intermediate data is read from the second SRAM in synchronization with the multiplication, and the sequentially-calculated products are cumulatively added to the read intermediate data to be written back into the second SRAM as the intermediate data. As a result, the calculated correlation function data is supplied to the comparator to be compared with a predetermined specified value.

8 Claims, 8 Drawing Sheets

CORRELATION OPERATION CIRCUIT AND SEMICONDUCTOR DEVICE

CROSS-REFERENCE TO RELATED APPLICATIONS

The disclosure of Japanese Patent Application No. 2016-102500 filed on May 23, 2016 including the specification, drawings and abstract is incorporated herein by reference in its entirety.

BACKGROUND

The present invention relates to a correlation operation circuit and a semiconductor device, and, in particular, can be preferably used in a correlation operation circuit that detects a waveform highly correlated with a desired waveform pattern.

A technique of detecting a desired signal pattern (detection pattern) from a signal waveform input from a sensor has been desired. In the related art, a correlation between the input signal waveform and the detection pattern is obtained, so that a complicated detection pattern can be recognized, or a detection pattern having high noise tolerance can be detected.

A correlation function for obtaining the correlation can be represented by the following equation.

[Equation 1]

$$R(\tau) = \sum_{t=\tau}^{\tau+N-1} f(t-\tau) * g(t) \quad (1)$$

In the equation, $R(\tau)$ represents a correlation function at time $\tau$, $f(t)$ represents a time series function (referred to as a "detection pattern function") representing a detection pattern, and $g(t)$ represents a time series function (referred to as a "measurement function") of an input signal waveform after being measured. Namely, the detection pattern is represented by pieces of data $f(0)$ to $f(N-1)$ of N points from $t=0$ to $t=N-1$.

FIG. 7 is a schematic explanatory diagram of the correlation operation. The correlation function $R(\tau)$ can be calculated by performing a product-sum operation for the measured waveform $g(t)$ at time t while being shifted by t. In FIG. 7, $g(t)$ at $\tau=9$ is in good agreement with the detection pattern function $f(t)$, and thus the correlation function $R(9)$ takes the maximum value.

Japanese Unexamined Patent Application Publication No. Hei 5 (1993)-282351 discloses a correlation function calculator. The correlation function calculator is configured to include a first storage unit into which first input data is written, a second storage unit into which second input data is written, and a product-sum operation unit that performs a product-sum operation by simultaneously reading data stored in the first storage unit and the second storage unit to obtain an autocorrelation function or a cross correlation function. Since the data necessary for the calculation can be simultaneously read, the processing time can be reduced.

SUMMARY

As a result of examination on Japanese Unexamined Patent Application Publication No. Hei 5 (1993)-282351, the inventors found the following new problems.

In the case where appearance of a specific signal pattern in a signal waveform measured by a sensor is detected using a microcomputer, the measured signal is converted into time series data by an A/D converter mounted in the microcomputer, and a correlation operation is executed in data processing by a CPU. In this case, A/D is an abbreviation of "Analog to Digital", and CPU is an abbreviation of "Central Processing Unit". The etymology of each of the following abbreviations will be enclosed in parentheses, at least, in one place.

FIG. 8 is an explanatory diagram for showing an example in which a correlation operation of detecting a specific signal pattern from a measured signal is executed using a microcomputer having a general configuration. A microcomputer 30 includes an A/D converter 1, a CPU 10, and an SRAM (Static Random Access Memory) 21, all of which are coupled to each other through a data bus 22. The microcomputer 30 includes an analog signal input terminal 23, and an analog signal input from the terminal is supplied to the A/D converter 1. The CPU 10 has a CPU internal bus 11, and includes registers 12 and 13, a product-sum operation unit 14, an accumulator 15, and a determination circuit 16. Some of them may be realized using software.

First, an analog signal is input to the A/D converter 1. Then, the signal is converted into a digital signal by the A/D converter 1, and the data is stored into the SRAM 21. Then, after storing all the time series data to be measured into the SRAM 21, the CPU 10 starts an operation process of a correlation function. First, a detection pattern function f(t) preliminarily stored in the SRAM 21 is stored into the register 12. Next, time series data g(t) stored in the SRAM 21 is stored into the register 13, and the product-sum operation of Equation 1 is executed. Then, the product-sum operation is sequentially executed in accordance with Equation 1 while storing f(t) and g(t) into the register 12 and the register 13, and a correlation function $R(\tau)$ such as R(0), R(1), R(2), or the like is calculated. Then, in the case where the value of the correlation function $R(\tau)$ exceeds a preliminarily-set standard value, it means that a detection pattern has been detected, and the operation is completed.

As described above, in the microcomputer of the related art, the calculation of the correlation function is started by the CPU 10 after obtaining all the time series data by the A/D converter 1 and the like. Thus, appearance of a specific signal pattern in time series signals to be input cannot be disadvantageously detected in real time. Namely, a single microcomputer cannot respond to pattern detection for which an urgent real-time process such as detection of a person in a car or detection of a seismic wave is required.

If a correlation function is calculated by such a general microcomputer in real time to detect an input pattern, the CPU 10 is always occupied by the operation process. Thus, the CPU 10 cannot disadvantageously perform the other application processes.

Means for solving such problems will be described below. The other objects and novel features will become apparent from the description of the specification and the accompanying drawings.

According to an embodiment, the invention is disclosed as follows.

Namely, provided is a correlation operation circuit that calculates a correlation function between sequentially-input time series data and a detection pattern represented by a plurality of pieces of detection pattern data. In a period from the time one time series data is input to the time the next time series data is input, intermediate data of all the correlation functions referring to the one time series data or the final value of the correlation function is obtained.

The correlation operation circuit includes a first memory storing the pieces of detection pattern data, a multiplier, an adder, a second memory in which intermediate data of a product-sum operation by the multiplier and the adder can be stored, and a comparator. When the time series data is sequentially input to one input of the multiplier one by one, the correlation operation circuit is configured to be operated as follows.

The multiplier sequentially multiplies one input time series data by the pieces of detection pattern data sequentially read from the first memory, and sequentially supplies the calculated product to one input of the adder. Corresponding intermediate data is read from the second memory to be sequentially supplied to the other input of the adder in synchronization with the multiplication, and the adder adds the product to the read intermediate data to be written back into the second memory as the intermediate data.

Data obtained by cumulatively adding the products between all the pieces of detection pattern data and the pieces of time series data as many as the detection pattern data is used as result data, and the comparator compares the result data with a predetermined specified value.

The following is a summary of effects obtained by the embodiment.

Namely, the correlation function between the sequentially-input time series data and the detection pattern data can be calculated in parallel with inputting of the time series data, and appearance of a specific signal pattern in the input time series data can be detected in real time.

DETAILED DESCRIPTION

Embodiments will be described in detail. It should be noted that constitutional elements having the same functions will be followed by the same signs in all the drawings for explaining "DETAILED DESCRIPTION", and the explanation thereof will not be repeated.

First Embodiment

Figure 1:
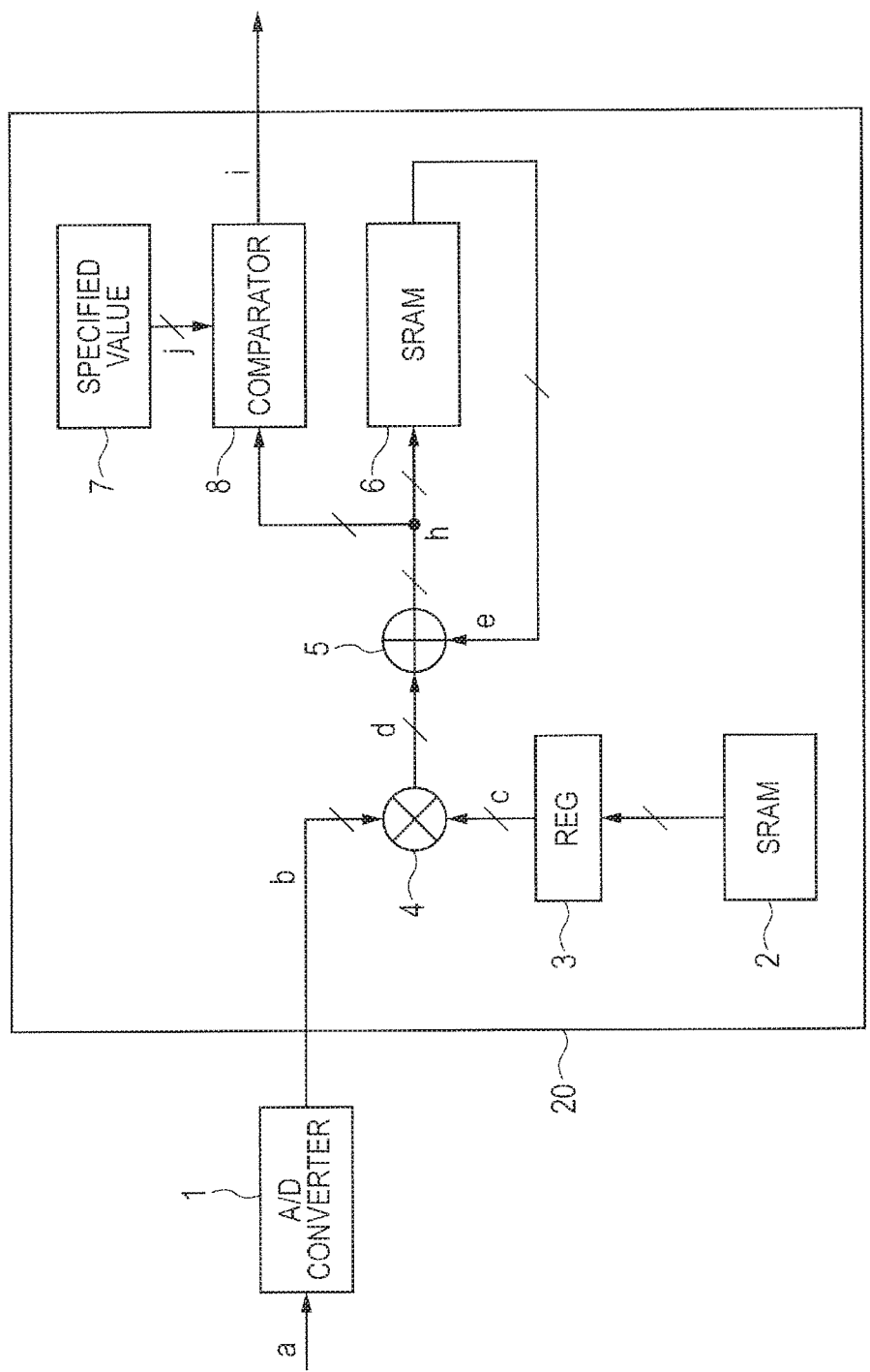
FIG. 1 is a block diagram for showing a configuration example of a correlation operation circuit according to a first embodiment.

FIG. 1 is a block diagram for showing a configuration example of a correlation operation circuit 20 according to a first embodiment.

The correlation operation circuit 20 includes an SRAM 2 that is a first memory, an SRAM 6 that is a second memory, a multiplier 4, an adder 5, and a storage element 7 holding a specified value, and an A/D converter 1 is coupled to the correlation operation circuit 20. Plural pieces of detection pattern data can be stored in the SRAM 2, and intermediate data of a product-sum operation by the multiplier 4 and the adder 5 can be stored in the SRAM 6. In order to configure the correlation operation circuit 20 so as to calculate a correlation function between sequentially-input time series data and a detection pattern represented by N (N is an integer equal to or larger than 2) pieces of detection pattern data, each of the SRAM 2 and the SRAM 6 is configured to have a storage capacity so that, at least, N pieces of data can be stored. Strictly speaking (for example, in the case where an initial value 0 and the correlation function that is the final value are not held in the SRAM 6), it is only necessary for the SRAM 6 to have a storage capacity so that N−1 pieces of data can be stored.

An analog signal a is input to an input terminal of the A/D converter 1, an output terminal of the A/D converter 1 is coupled to one input terminal of the multiplier 4, and time series data b obtained by converting the analog signal a into digital data is sequentially supplied. An output of the SRAM 2 is coupled to the other input terminal of the multiplier 4 through a register 3, and the N pieces of detection pattern data stored in the SRAM 2 can be sequentially read to be supplied to the multiplier 4. An output d of the multiplier 4 is coupled to one input terminal of the adder 5, an output e of the SRAM 6 is supplied to the other input terminal of the adder 5, and an output h of the adder 5 is coupled to an input of the SRAM 6. The output h of the adder 5 is further coupled to a comparator 8. The comparator 8 compares the output h with a specified value j to be input, and outputs a comparison result i. The reference numeral 7 denotes a storage element holding the specified value, and, for example, a register that can be rewritten from the outside is mounted.

When one time series data is input to the multiplier 4, the N pieces of detection pattern data are sequentially read from the SRAM 2, and are input to the multiplier 4 through the register 3. Accordingly, multiplications are executed N times, and N products d to be calculated are sequentially input to one terminal of the adder 5. In synchronization with the multiplications, intermediate data corresponding to each of the sequentially-calculated products is read from the SRAM 6, and is supplied to an input e of the adder 5, so that the adder 5 adds the corresponding product to the intermediate data to be written back into the SRAM 6 as the intermediate data. In this case, it is assumed that a product between first detection pattern data and the one input time series data is a first product. This corresponds to the first term of the correlation function shown in Equation 1. Data h obtained by cumulatively adding the products between all the N pieces of detection pattern data and N pieces of time series data corresponds to result data, namely, a correlation function. The comparator 8 compares the result data with a predetermined specified value. For example, when the result data, namely, the correlation function exceeds the predetermined specified value, the comparison result i is output by assuming that the detection pattern represented by the N pieces of detection pattern data appears in the input time series data.

Accordingly, the correlation function between the sequentially-input time series data and the detection pattern data can be calculated in parallel with inputting of the time series data, and appearance of a specific signal pattern in the input time series data can be detected in real time.

An operation of the correlation operation circuit 20 will be described in more detail. It should be noted that the number of pieces of detection pattern data is assumed as 4 in the following description to avoid complication thereof. Namely, four pieces of time series data f(0), f(1), f(2), and f(3) are used as the detection pattern data. On the other hand, the time series data input from the A/D converter 1 is represented by g(t)=g(0), g(1), g(2), g(3), g(4), and the like. Further, it is assumed that each of f(t) and g(t) is configured using digital data having plural bits such as 8 bits. When g(0), g(1), g(2), and g(3) are input, a correlation function R(0)=f(0)·g(0)+f(1)·g(1)+f(2)·g(2)+f(3)·g(3) can be calculated. Thereafter, when g(4) is input, R(1)=f(0)·g(1)+f(1)·g(2)+f(2)·g(3)+f(3)·g(4) can be calculated. When g(5) is input, R(2)=f(0)·g(2)+f(1)·g(3)+f(2)·g(4)+f(3)·g(5) can be calculated. When g(6) is input, R(3)=f(0)·g(3)+f(1)·g(4)+f(2)·g(5)+f(3)·g(6) can be calculated. When g(7) is input, R(4)=f(0)·g(4)+f(1)·g(5)+f(2)·g(6)+f(3)·g(7) can be calculated.

The correlation operation circuit 20 does not execute an operation of the correlation function of the four terms for the first time when g(4) is input. When g(4) is input, the correlation operation circuit 20 calculates the intermediate data of all the correlation functions to be calculated using g(4), and writes and holds the data into the SRAM 6. Namely, the product f(2)·g(4) for the next R(2) and the accumulation f(0)·g(2)+f(1)·g(3)+f(2)·g(4), the product f(1)·g(4) for R(3) and the accumulation f(0)·g(3)+f(1)·g(4), and the product f(0)·g(4) for R(4) are calculated, and are written and held into the SRAM 6 as the intermediate data.

As described above, the correlation function with the detection pattern data can be calculated in parallel with inputting of the time series data, and thus appearance of a specific signal pattern in the input time series data can be detected in real time.

Figure 2:
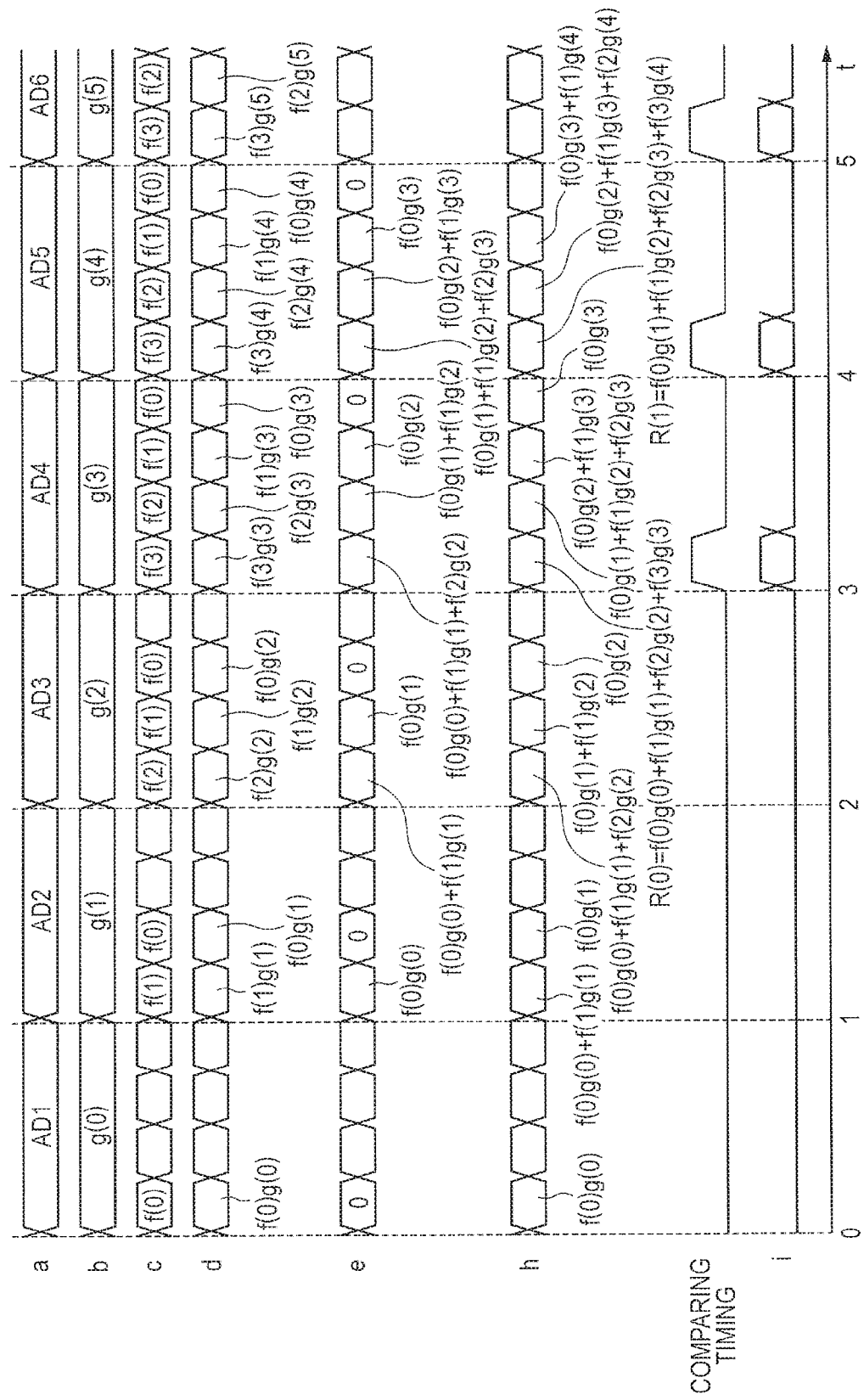
FIG. 2 is a timing chart for showing an operation example of the correlation operation circuit.

FIG. 2 is a timing chart for showing an operation example of the correlation operation circuit 20.

Analog data AD0 is input to an input a of the A/D converter 1 at time t=−1 (not shown), and then digital data g(0) after AD conversion is output from an output b of the A/D converter 1 at time t=0.

Further, analog data AD1 is input to the input a of the A/D converter 1 at time t=0, and then digital data g(1) after AD conversion is output from the output b of the A/D converter 1 at time t=1.

Further, analog data AD2 is input to the input a of the A/D converter 1 at time t=1, and then digital data g(2) after AD conversion is output from the output b of the A/D converter 1 at time t=2.

Further, analog data AD3 is input to the input a of the A/D converter 1 at time t=2, and then digital data g(3) after AD conversion is output from the output b of the A/D converter 1 at time t=3. Thereafter, the same process is performed.

Next, an operation of FIG. 2 will be described with reference to FIG. 1.

In the period from time t=0 to time t=1, the detection pattern data f(0) is output from the SRAM 2 of FIG. 1 to c of FIG. 1 in a state where g(0) is output to b of FIG. 1. At this time, a product operation is executed, and the product of f(0)·g(0) is output to d of FIG. 1. On the other hand, 0 is read from the SRAM 6 as the initial value of R(0), and is input to e. After d=f(0)·g(0) and e=0 are added to each other by the adder 5, the operation result passes through h, and is stored at the address for R(0) of the SRAM 6 as the intermediate data of R(0).

Next, in the period from time t=1 to time t=2, the detection pattern data f(1) is first output from the SRAM 2 of FIG. 1 to c of FIG. 1 in a state where g(1) is output to b of FIG. 1. At this time, a product operation is executed, and the product of f(1)·g(1) is output to d of FIG. 1. On the other hand, f(0)·g(0) is read from the SRAM 6 as the intermediate data of R(0), and is input to e. After d=f(1)·g(1) and e=f(0)·g(0) are added to each other by the adder 5, the operation result passes through h, and is stored at the address for R(0) of the SRAM 6 as the intermediate data of R(0).

In the period from time t=1 to time t=2, the detection pattern data f(0) is next output from the SRAM 2 of FIG. 1 to c of FIG. 1 in a state where g(1) is output to b of FIG. 1. At this time, a product operation is executed, and the product of f(0)·g(1) is output to d of FIG. 1. On the other hand, 0 is read from the SRAM 6 as the initial value of R(1), and is input to e. After d=f(0)·g(1) and e=0 are added to each other by the adder 5, the operation result passes through h, and is stored at the address for R(1) of the SRAM 6 as the intermediate data of R(1).

Next, in the period from time t=2 to time t=3, the detection pattern data f(2) is first output from the SRAM 2 of FIG. 1 to c of FIG. 1 in a state where g(2) is output to b of FIG. 1. At this time, a product operation is executed, and the product of f(2)·g(2) is output to d of FIG. 1. On the other hand, f(0)·g(0)+f(1)·g(1) is read from the SRAM 6 as the intermediate data of R(0), and is input to e. After d=f(2)·g(2) and e=f(0)·g(0)+f(1)·g(1) are added to each other by the adder 5, the operation result passes through h, and is stored at the address for R(0) of the SRAM 6 as the intermediate data of R(0).

In the period from time t=2 to time t=3, the detection pattern data f(1) is next output from the SRAM 2 of FIG. 1 to c of FIG. 1 in a state where g(2) is output to b of FIG. 1. At this time, a product operation is executed, and the product of f(1)·g(2) is output to d of FIG. 1. On the other hand, f(0)·g(1) is read from the SRAM 6 as the intermediate data of R(1), and is input to e. After d=f(1)·g(2) and e=f(0)·g(1) are added to each other by the adder 5, the operation result passes through h, and is stored at the address for R(1) of the SRAM 6 as the intermediate data of R(1).

In the period from time t=2 to time t=3, the detection pattern data f(0) is next output from the SRAM 2 of FIG. 1 to c of FIG. 1 in a state where g(2) is output to b of FIG. 1. At this time, a product operation is executed, and the product of f(0)·g(2) is output to d of FIG. 1. On the other hand, 0 is read from the SRAM 6 as the initial value of R(2), and is input to e. After d=f(0)·g(2) and e=0 are added to each other by the adder 5, the operation result passes through h, and is stored at the address for R(2) of the SRAM 6 as the intermediate data of R(2).

Next, in the period from time t=3 to time t=4, the detection pattern data f(3) is first output from the SRAM 2 of FIG. 1 to c of FIG. 1 in a state where g(3) is output to b of FIG. 1. At this time, a product operation is executed, and the product of f(3)·g(3) is output to d of FIG. 1. On the other hand, f(0)·g(0)+f(1)·g(1)+f(2)·g(2) is read from the SRAM 6 as the intermediate data of R(0), and is input to e. After d=f(3)·g(3) and e=f(0)·g(0)+f(1)·g(1)+f(2)·g(2) are added to each other by the adder 5, the operation result passes through h, and is stored at the address for R(0) of the SRAM 6 as the final result data of R(0). Finally, R(0)=f(0)·g(0)+f(1)·g(1)+f(2)·g(2)+f(3)·g(3) is satisfied. At this time, the final result data of R(0) is simultaneously input to the comparator 8, and is compared with the specified value 7 that is preliminarily stored in the comparator 8. If R(0) exceeds the specified value, it means that the detection pattern has been detected, and a pattern detection signal i is output from the comparator 8. In this case, the operation of the correlation operation circuit 20 of FIG. 1 is stopped. In the case where R(0) does not exceed the specified value, the following operation is continued.

Here, in the case where the correlation operation circuit 20 is mounted in, for example, a semiconductor device 30 that is an LSI (Large Scale Integrated circuit) such as a microcomputer as will be described later, the pattern detection signal i output from the comparator 8 can be used as an interrupt request signal. The microcomputer executes an interrupt operation in accordance with the interrupt signal.

In the case where R(0) does not exceed the specified value, the detection pattern data f(2) is next output from the SRAM 2 of FIG. 1 to c of FIG. 1 in a state where g(3) is output to b of FIG. 1 in the period from time t=3 to time t=4. At this time, a product operation is executed, and the product of f(2)·g(3) is output to d of FIG. 1. On the other hand, f(0)·g(1)+f(1)·g(2) is read from the SRAM 6 as the intermediate data of R(1), and is input to e. After d=f(2)·g(3) and e=f(0)·g(1)+f(1)·g(2) are added to each other by the adder 5, the operation result passes through h, and is stored at the address for R(1) of the SRAM 6 as the intermediate data of R(1).

In the period from time t=3 to time t=4, the detection pattern data f(1) is next output from the SRAM 2 of FIG. 1 to c of FIG. 1 in a state where g(3) is output to b of FIG. 1. At this time, a product operation is executed, and the product of f(1)·g(3) is output to d of FIG. 1. On the other hand, f(0)·g(2) is read from the SRAM 6 as the intermediate data of R(2), and is input to e. After d=f(1)·g(3) and e=f(0)·g(2) are added to each other by the adder 5, the operation result passes through h, and is stored at the address for R(2) of the SRAM 6 as the intermediate data of R(2).

In the period from time t=3 to time t=4, the detection pattern data f(0) is next output from the SRAM 2 of FIG. 1 to c of FIG. 1 in a state where g(3) is output to b of FIG. 1. At this time, a product operation is executed, and the product of f(0)·g(3) is output to d of FIG. 1. On the other hand, 0 is read from the SRAM 6 as the initial value of R(3), and is input to e. After d=f(0)·g(3) and e=0 are added to each other by the adder 5, the operation result passes through h, and is stored at the address for R(3) of the SRAM 6 as the intermediate data of R(3).

Next, in the period from time t=4 to time t=5, the detection pattern data f(3) is first output from the SRAM 2 of FIG. 1 to c of FIG. 1 in a state where g(4) is output to b of FIG. 1. At this time, a product operation is executed, and the product of f(3)·g(4) is output to d of FIG. 1. On the other hand, f(0)·g(1)+f(1)·g(2)+f(2)·g(3) is read from the SRAM 6 as the intermediate data of R(1), and is input to e. After d=f(3)·g(4) and e=f(0)·g(1)+f(1)·g(2)+f(2)·g(3) are added to each other by the adder 5, the operation result passes through h, and is stored at the address for R(1) of the SRAM 6 as the final result data of R(1). Finally, R(1)=f(0)·g(1)+f(1)·g(2)+f(2)·g(3)+f(3)·g(4) is satisfied. At this time, the final result data of R(1) is simultaneously input to the comparator 8, and is compared with the specified value 7 that is preliminarily stored in the comparator 8. If R(1) exceeds the specified value, it means that the detection pattern has been detected, and the pattern detection signal i is output from the comparator 8. In this case, the operation of the correlation operation circuit 20 of FIG. 1 is stopped. In the case where R(1) does not exceed the specified value, the following operation is further continued.

In the period from time t=4 to time t=5, the detection pattern data f(2) is next output from the SRAM 2 of FIG. 1 to c of FIG. 1 in a state where g(4) is output to b of FIG. 1. At this time, a product operation is executed, and the product of f(2)·g(4) is output to d of FIG. 1. On the other hand, f(0)·g(2)+f(1)·g(3) is read from the SRAM 6 as the intermediate data of R(2), and is input to e. After d=f(2)·g(4) and e=f(0)·g(2)+f(1)·g(3) are added to each other by the adder 5, the operation result passes through h, and is stored at the address for R(2) of the SRAM 6 as the intermediate data of R(2).

In the period from time t=4 to time t=5, the detection pattern data f(1) is next output from the SRAM 2 of FIG. 1 to c of FIG. 1 in a state where g(4) is output to b of FIG. 1. At this time, a product operation is executed, and the product of f(1)·g(4) is output to d of FIG. 1. On the other hand, f(0)·g(3) is read from the SRAM 6 as the intermediate data of R(3), and is input to e. After d=f(1)·g(4) and e=f(0)·g(3) are added to each other by the adder 5, the operation result passes through h, and is stored at the address for R(3) of the SRAM 6 as the intermediate data of R(3).

In the period from time t=4 to time t=5, the detection pattern data f(0) is next output from the SRAM 2 of FIG. 1 to c of FIG. 1 in a state where g(4) is output to b of FIG. 1. At this time, a product operation is executed, and the product of f(0)·g(4) is output to d of FIG. 1. On the other hand, 0 is read from the SRAM 6 as the initial value of R(4), and is input to e. After d=f(0)·g(4) and e=0 are added to each other by the adder 5, the operation result passes through h, and is stored at the address for R(4) of the SRAM 6 as the intermediate data of R(4).

Thereafter, the same operation is continued. Namely, the correlation functions R(0), R(1), R(2), R(3), R(4), and the like are sequentially calculated as described above, and the final result data of each R(n) is determined by the comparator 8.

It is preferable that the correlation operation circuit 20 as described above is mounted in, for example, the semiconductor device 30 that is an LSI such as a microcomputer.

Figure 3:
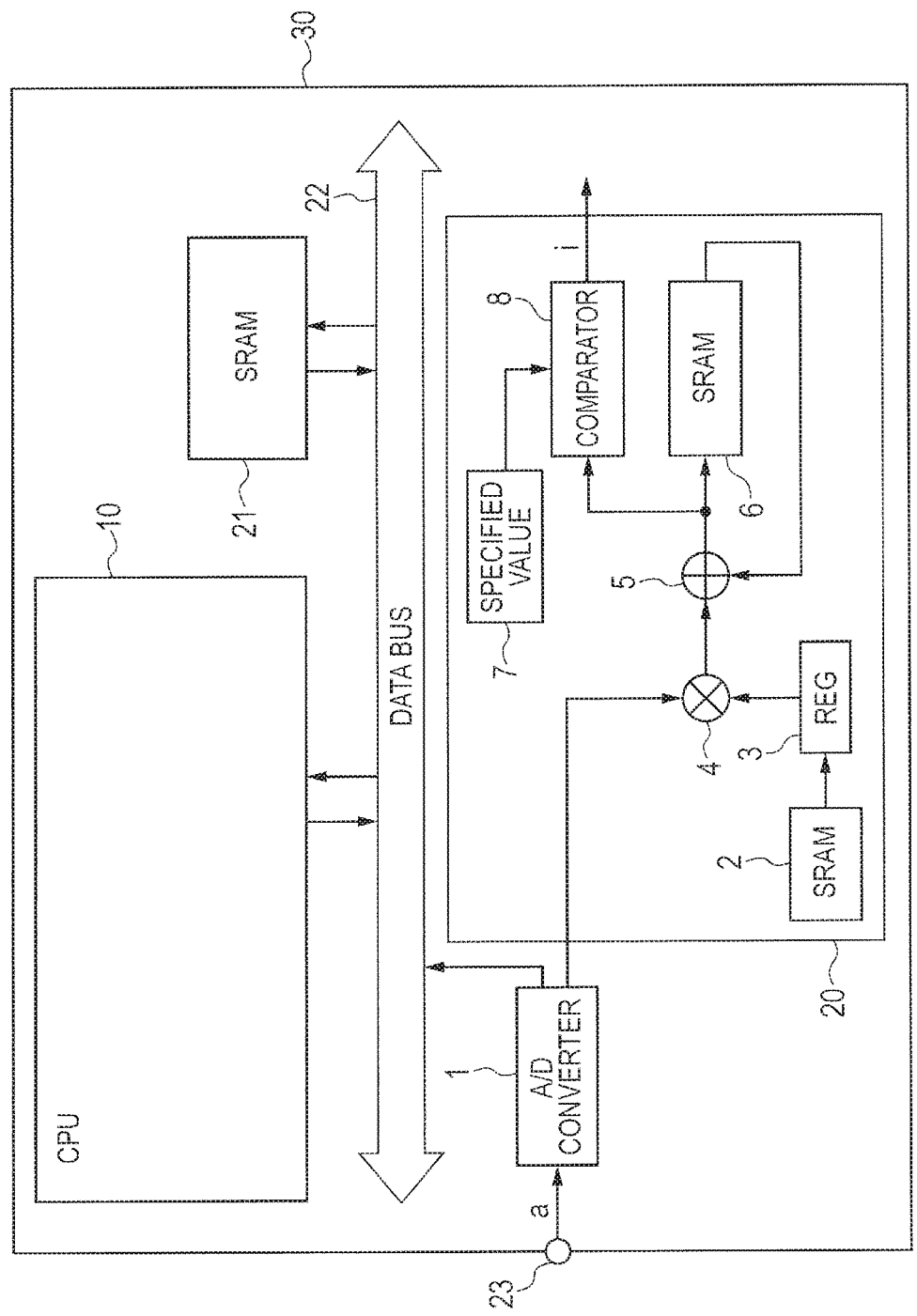
FIG. 3 is a block diagram for showing a configuration example of a semiconductor device according to the first embodiment.

FIG. 3 is a block diagram for showing a configuration example of the semiconductor device 30 according to the first embodiment. The semiconductor device 30 includes a CPU 10, a bus 22, an A/D converter 1, and the correlation operation circuit 20. As shown in the drawing, an SRAM 21 coupled to the bus 22 may be further provided. The semiconductor device 30 is formed on a single semiconductor substrate such as silicon using, for example, a well-known manufacturing technique of a CMOS (Complementary Metal-Oxide-Semiconductor field effect transistor) LSI.

The A/D converter 1 can sequentially convert analog signals input from a terminal 23 into time series data, and the CPU 10 can obtain the time series data that is a conversion result through the bus 22. It is not always necessary to configure the CPU 10 to be able to obtain the conversion result of the A/D converter 1. However, the function of a general microcomputer in the case where the correlation operation circuit 20 is not used can be maintained by configuring the CPU 10 to be able to obtain the conversion result of the A/D converter 1.

The correlation operation circuit 20 includes the SRAM 2 into which plural pieces of detection pattern data representing a specific signal pattern to be detected are stored, the multiplier 4, the adder 5, the SRAM 6 into which intermediate data of a product-sum operation by the multiplier 4 and the adder 5 can be stored, and the comparator 8.

The multiplier 4 sequentially multiplies one time series data input from the A/D converter 1 by plural pieces of detection pattern data sequentially read from the SRAM 2, and the calculated products are sequentially supplied to one input of the adder 5. In synchronization with the multiplications, the corresponding intermediate data is read from the SRAM 6 to be sequentially supplied to the other input of the adder 5. The adder 5 adds each product that is the multiplication result to the corresponding intermediate data to be written back into the SRAM 6 as the intermediate data. Data obtained by cumulatively adding the products between all the pieces of detection pattern data and the pieces of time series data as many as the detection pattern data corresponds to the result data. Namely, the intermediate data is stored in the SRAM 6, and the next product is cumulatively added to the read intermediate data to be written back into the SRAM 6 as the intermediate data. By repeating the operation, cumulative adding operations are executed the number of times corresponding to the number of pieces of detection pattern data representing a specific signal pattern. When all the operations are completed, the data is output as the result data, namely, the correlation function.

Accordingly, it is possible to provide a semiconductor device such as a microcomputer in which the correlation function between the sequentially-input time series data and the detection pattern data can be calculated in parallel with inputting of the time series data, and appearance of a specific signal pattern in the input time series data can be detected in real time.

The result data in this case is the correlation function between a specific signal pattern to be detected and the input time series data. The comparator 8 compares the result data with a predetermined specified value. When the result exceeds the predetermined specified value, the correlation operation circuit 20 generates an interrupt request to the CPU 10.

A register 3 that temporarily holds the detection pattern data read from the SRAM 2 and a storage element 7 to provide the "predetermined specified value" to the comparator 8 may be further provided. Further, although not shown in the drawing, the semiconductor device 30 further includes an interrupt control circuit. The interrupt request to the CPU 10 is input to the interrupt control circuit, and is transferred to the CPU 10 after a process such as a mask process of the interrupt request and an arbitration process with a different interrupt request. Then, an interrupt process is actually executed. The different interrupt request in this case includes, for example, an interrupt request from the A/D converter 1 to notify completion of the A/D conversion process.

Effects obtained by the first embodiment will be described.

Figure 4:
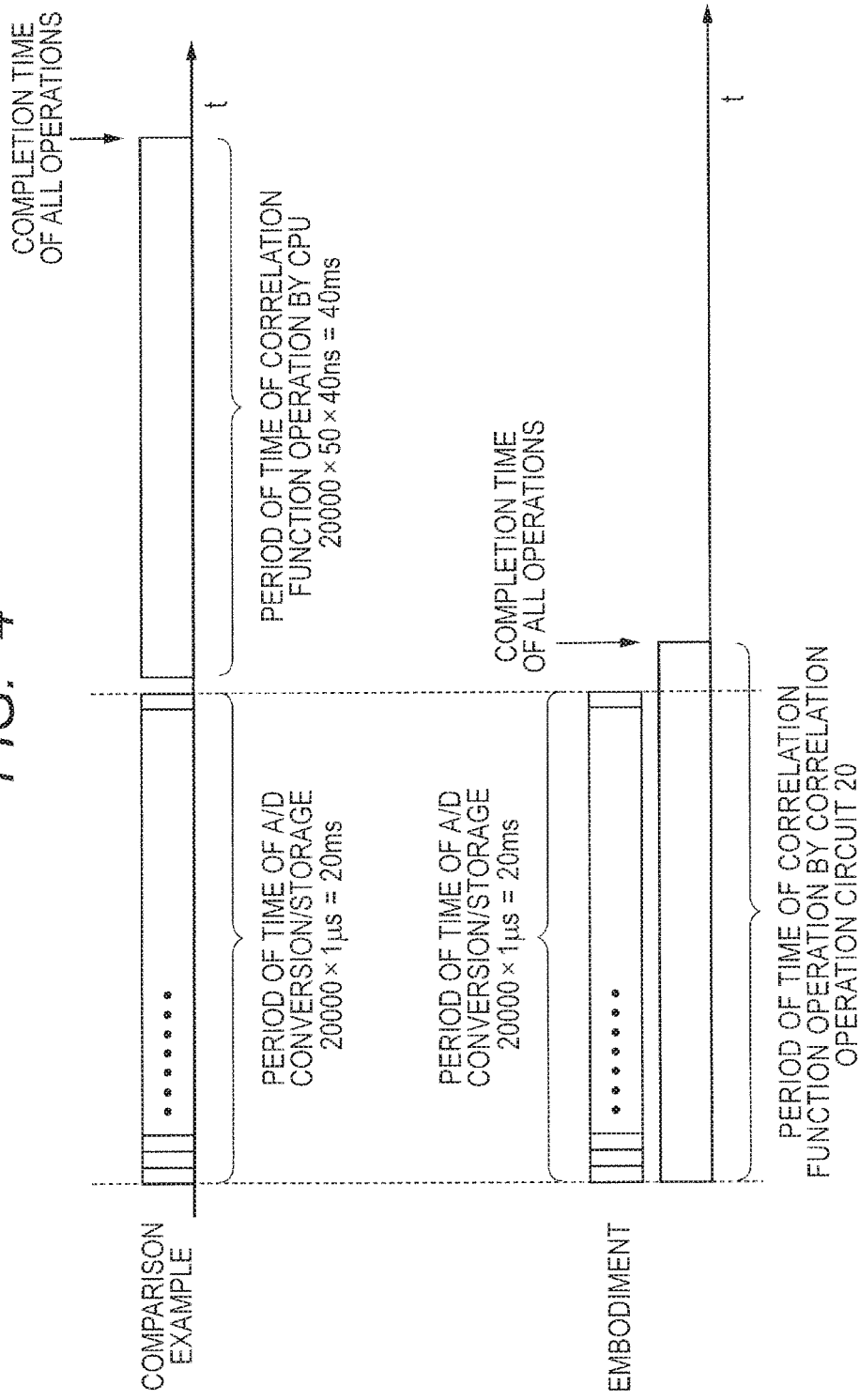
FIG. 4 is an explanatory diagram for showing effects of the first embodiment.
Figure 8:
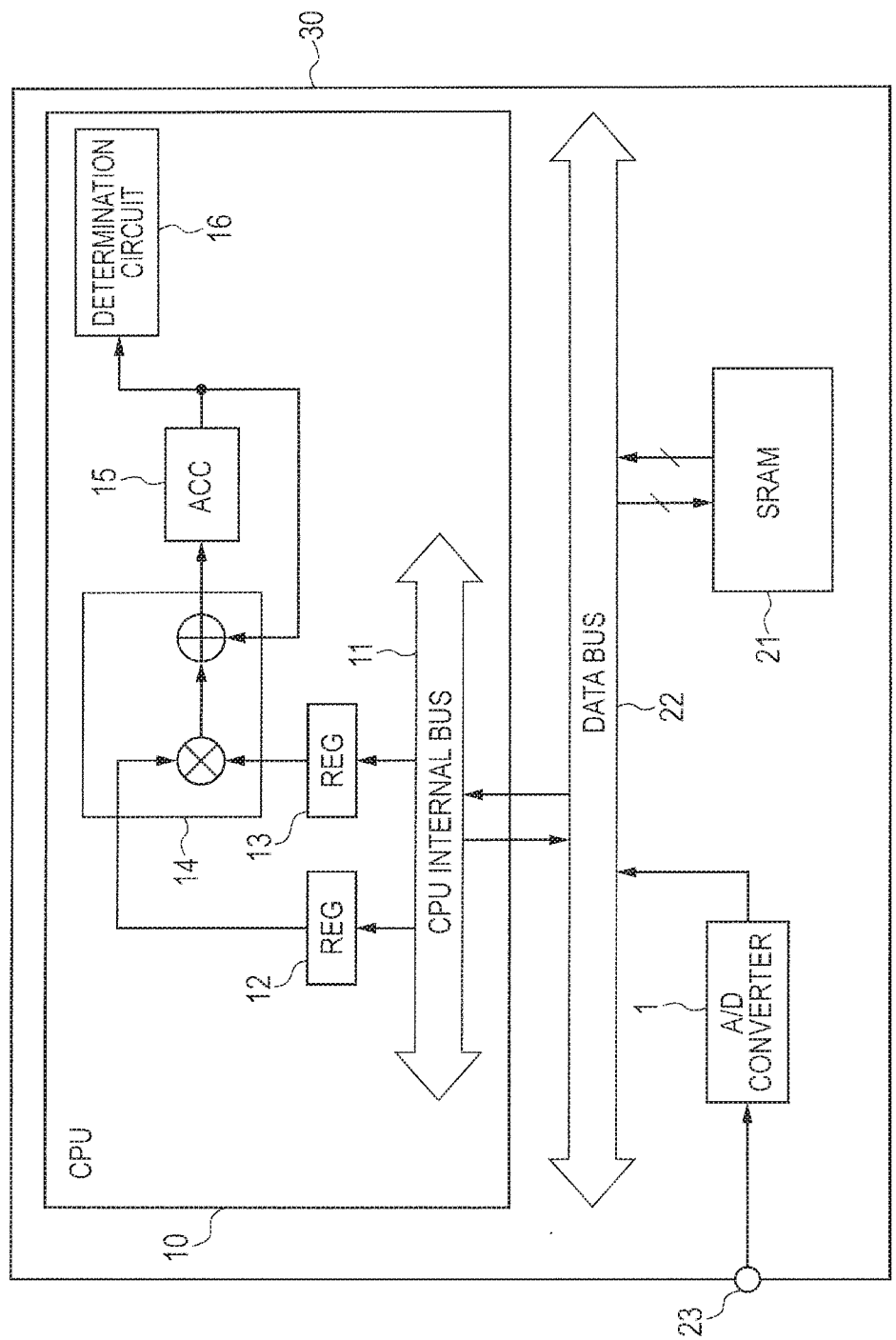
FIG. 8 is an explanatory diagram for showing an example in which a correlation operation of detecting a specific signal pattern from a measured signal is executed using a microcomputer having a general configuration.

FIG. 4 is an explanatory diagram for showing the effects. An example of executing the correlation operation for detecting a specific signal pattern from the measured signal using the microcomputer having a general configuration described in "SUMMARY" with reference to FIG. 8 is shown in the upper stage as a "comparison example", and an example of the correlation operation by the first embodiment is shown in the lower stage as an "embodiment". Each horizontal axis represents time t.

It is assumed that the number of pieces of detection pattern data representing a specific signal pattern to be detected is 50, namely, the number of points of the detection pattern function f(t) is 50, and the number of points of the time series data sequentially input from the A/D converter 1 is 20000. Further, it is assumed that a period of time of executing the A/D conversion by the A/D converter 1 is 1 μs per point, a period of time of executing the product-sum operation by a CPU 10 of the comparison example is 40 ns per point, and a period of time of executing the product-sum operation by the correlation operation circuit 20 of the first embodiment is 20 ns per point.

As shown in FIG. 4, a period of time required for the A/D converter 1 to output the time series data of 20000 points by sequentially A/D-converting the input analog signals is 20000×1 μs=20 ms in each of the comparison example and the embodiment.

In the comparison example, when the A/D conversion of the time series data of 20000 points is completed, all the results are once stored in the SRAM 21 (FIG. 8). Thereafter, the CPU 10 executes the operation of the correlation function while sequentially capturing necessary data. Since the period of time of executing the product-sum operation by the CPU 10 is 40 ns per point, a period of time required to complete the operation of the correlation function for all the time series data of 20000 points is 20000×50×40 ns=40 ms.

On the other hand, a period of time required to output the time series data of 20000 points after the A/D conversion is also 20 ms in the embodiment. However, the correlation operation circuit 20 starts the operation (f(0)×g(0)) of the correlation function immediately when the first time series data (g(0) in FIG. 2) is input as shown in FIG. 2. Thereafter, every time new time series data is input, the correlation operation circuit 20 executes all the operations of the correlation function using the data in a possible range (the intermediate data before completion of the operation is temporarily stored in the SRAM 6). As described above, the correlation function is sequentially obtained in parallel with the A/D conversion of the A/D converter 1. Thus, when the last time series data of 20000 points is input, all the correlation function operations can be completed if only the operation (f(0)×g(20000) to f(49)×g(20000)) of the correlation function requiring the data is executed.

Accordingly, it can be understood on the basis of the comparison between the both that there is a maximum time difference of about 40 ms to detect the detection pattern. However, the operation can be actually completed when the detection pattern is detected even in the middle of the correlation function operation period of 40 ms by the CPU in the comparison example, and the operation can be completed when the detection pattern is detected even in the middle of the correlation function operation executed by the correlation operation circuit 20 in parallel with the A/D conversion even in the embodiment In this case, almost the same period of time can be shortened in the comparison example and the embodiment, and thus the time difference between the both is about 40 ms.

The embodiment is characterized in that the correlation function operation is executed in parallel with the A/D conversion. Accordingly, the correlation function operation can be started 20 ms earlier as compared to the comparison example in which the correlation function operation is started after the A/D conversion of all the time series data of 20000 points. As a result, when time series data having a pattern that matches the detection pattern is input, the data can be immediately detected. Namely, the correlation function between the sequentially-input time series data and the detection pattern data can be calculated in parallel with inputting of the time series data, and appearance of a specific signal pattern in the input time series data can be detected in real time.

Further, since the correlation operation circuit 20 is a dedicated circuit, the correlation operation circuit 20 can execute the product-sum operation faster than the general CPU 10. In addition, the power consumption required for the operation is low. Therefore, the power consumption can be advantageously reduced in the embodiment as compared to the comparison example.

Second Embodiment

Figure 5:
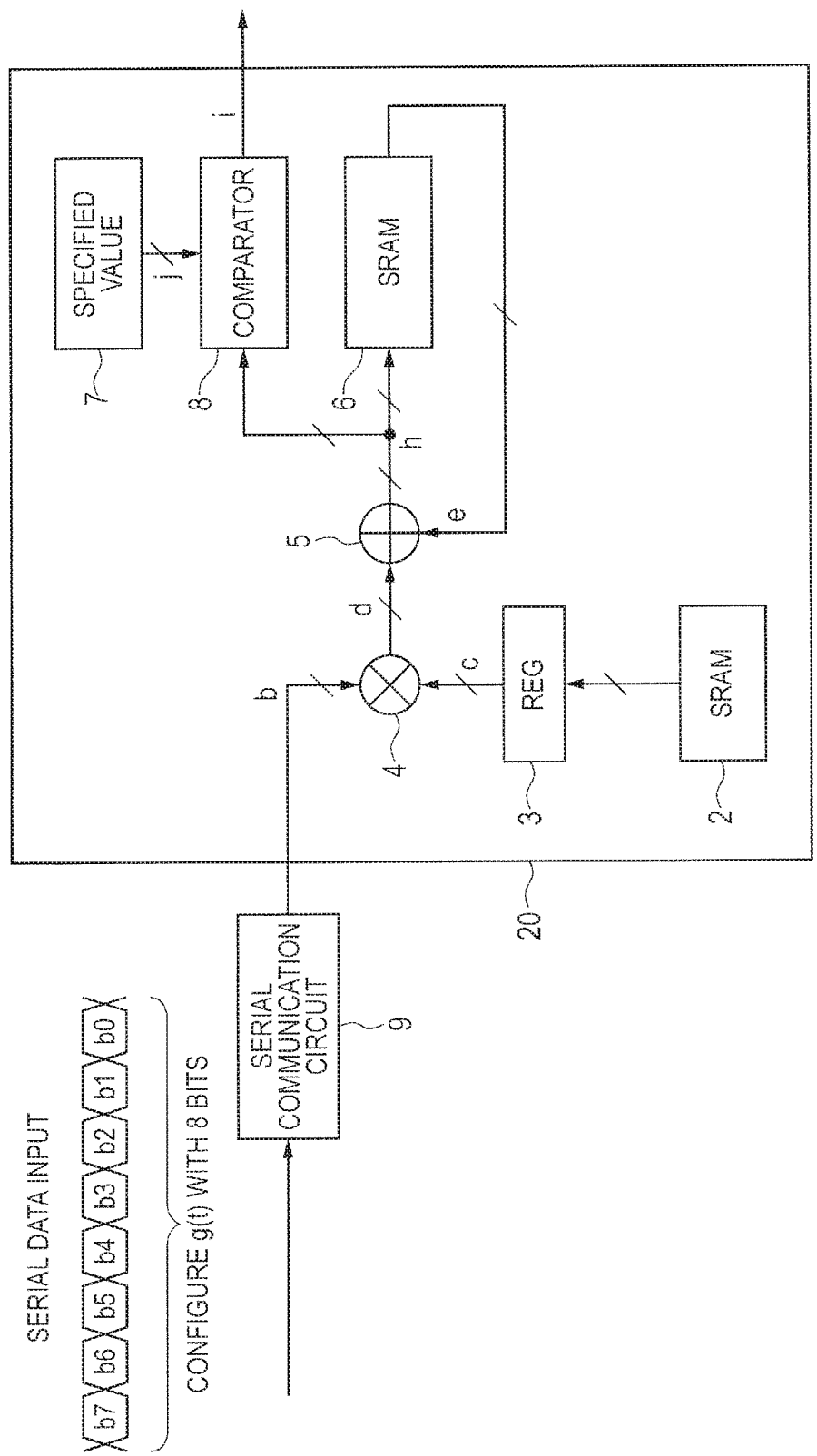
FIG. 5 is a block diagram for showing a configuration example of a correlation operation circuit according to a second embodiment.

FIG. 5 is a block diagram for showing a configuration example of a correlation operation circuit 20 according to a second embodiment. The correlation operation circuit 20 of the second embodiment is different from that of the first embodiment shown in FIG. 1 in that the A/D converter 1 is replaced by a serial communication circuit 9. However, other configurations are the same. The serial communication circuit in the second embodiment is a communication circuit having a serial interface such as a UART (Universal Asynchronous Receiver Transmitter).

For example, 8-bit time series data g(t) is serially input to the serial communication circuit 9, and is output after being converted into parallel data. Majority of sensors convert a measured value into a digital value, and then output serial data obtained by converting the digital value in many cases. The numbers of terminals and signal lines required to couple such a sensor to a microcomputer can be significantly reduced as compared a case in which parallel data is transmitted as it is, contributing to reduction of cost.

For example, 8-bit g(0) is input to the serial communication circuit 9 as serial communication data. Then, when the inputting of all the pieces of 8-bit serial data is completed, g(0) is output to b as 8-bit parallel data. Then, detection pattern data f(0) is output to c from the SRAM 2. In this case, a product operation is executed, and the product of f(0)·g(0) is output to d. Then, after the product of f(0)·g(0) and intermediate data input to e are added to each other, the operation result passes through h, and is stored at the address for R(0) of the SRAM 2 as the intermediate data of R(0). The initial value of R(0) that is first input to e is 0. For example, 0 stored at the address for R(0) of the SRAM 6 as the initial value is read, and is supplied to e. The operation thereafter is the same as that in the first embodiment, and thus the explanation will be omitted.

Accordingly, even in the case where time series data is serially input, the correlation function between the sequentially-input time series data and the detection pattern data can be calculated in parallel with inputting of the time series data, and appearance of a specific signal pattern in the input time series data can be detected in real time.

Figure 6:
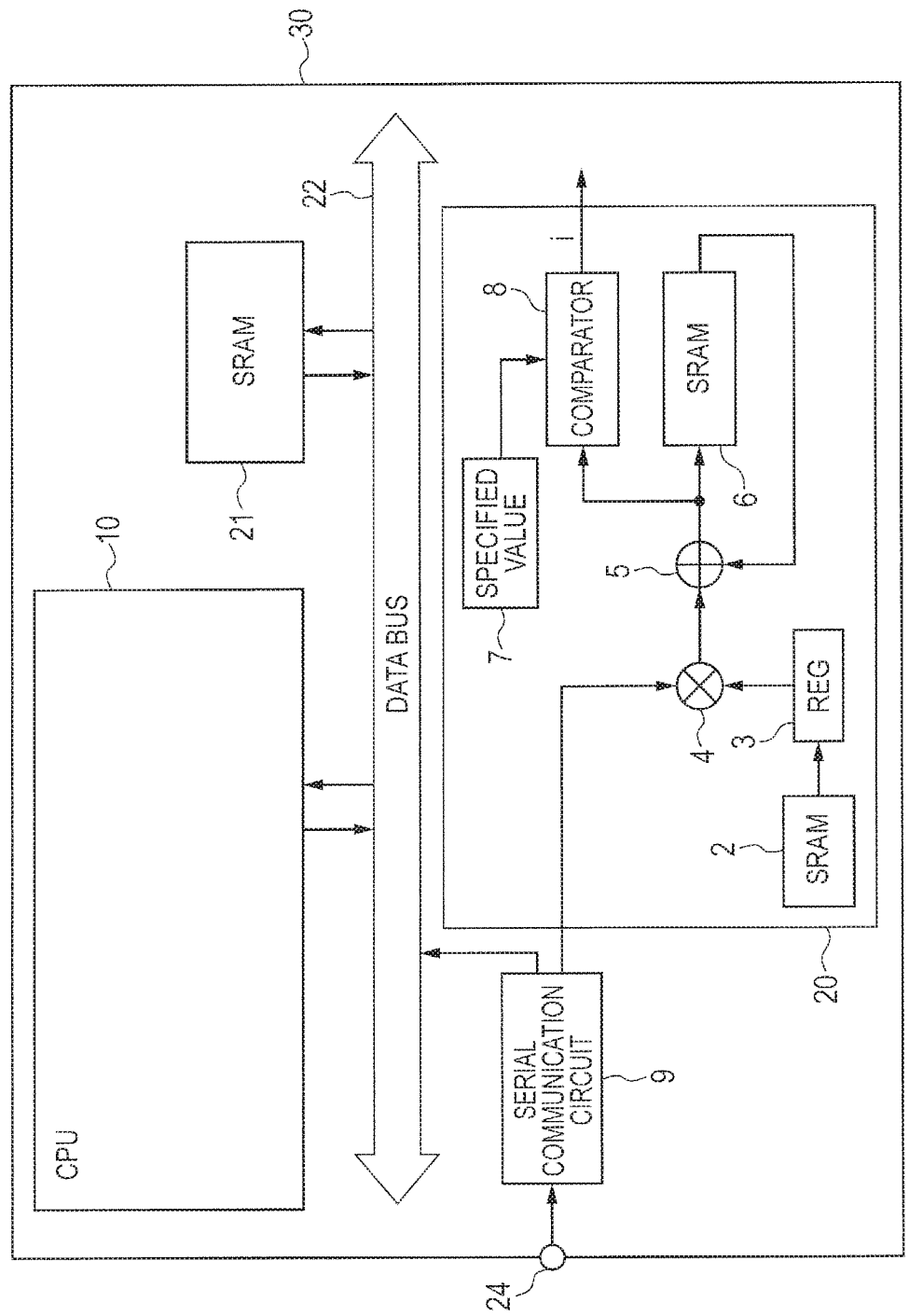
FIG. 6 is a block diagram for showing a configuration example of a semiconductor device according to the second embodiment.
Figure 7:
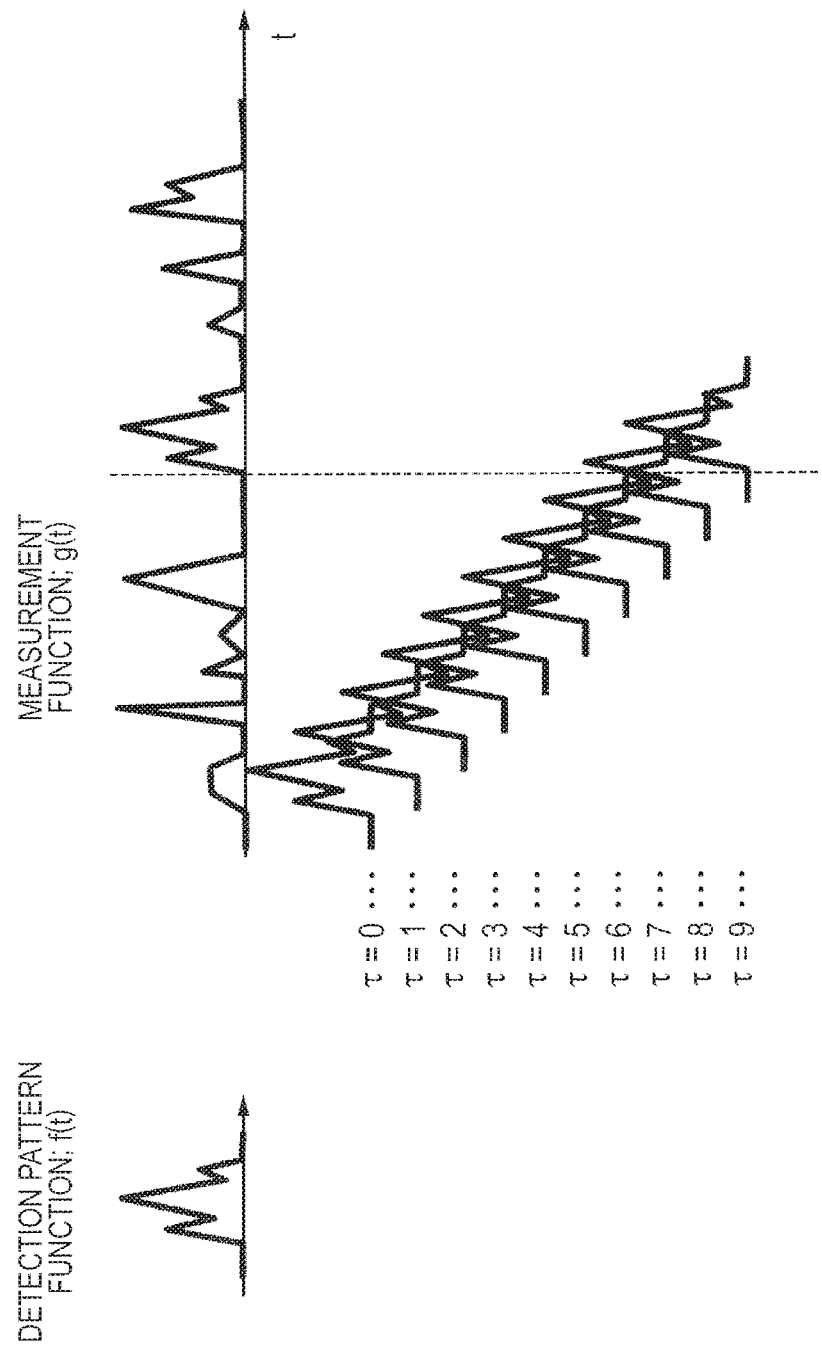
FIG. 7 is an explanatory diagram for schematically showing a correlation operation that detects a specific signal pattern from a measured signal.

FIG. 6 is a block diagram for showing a configuration example of a semiconductor device 30 according to the second embodiment. As similar to the semiconductor device 30 of the first embodiment shown in FIG. 3, the semiconductor device 30 includes the CPU 10, the bus 22, the correlation operation circuit 20, and the serial communication circuit 9 instead of the A/D converter 1. As shown in the drawing, the semiconductor device 30 may similarly include the SRAM 21 coupled to the bus 22.

The serial communication circuit 9 can sequentially convert serial data signals input from a terminal 24 into parallel time series data, and the CPU 10 can obtain the converted parallel time series data through the bus 22. The converted parallel time series data is sequentially input to the correlation operation circuit 20.

The configuration and operation of the correlation operation circuit 20 are the same as those in the first embodiment, and thus the explanation thereof will be omitted.

Accordingly, the pattern detection can be executed for the signal pattern input as serial data in real time without using the CPU 10. Further, as similar to the first embodiment, the operation period of time of the CPU 10 can be reduced, and the power consumption can be effectively reduced.

The semiconductor device 30 shown in the second embodiment includes the serial communication circuit 9 instead of the A/D converter 1, but may be configured to include the serial communication circuit 9 in addition to the A/D converter 1. In this case, the semiconductor device 30 can be programmable by further including a selection circuit that determines whether data is input to the correlation operation circuit 20 from the A/D converter 1 or the serial communication circuit 9. Alternatively, the semiconductor device 30 may be configured in such a manner that plural correlation operation circuits 20 each having the A/D converter 1 or the serial communication circuit 9 are mounted in one semiconductor device 30, and can be coupled to many sensors.

The invention achieved by the inventors has been described above in detail on the basis of the embodiments. However, it is obvious that the present invention is not limited to the embodiments, but may be variously changed without departing from the scope thereof.

For example, the number of bits and the number of points exemplified in each embodiment are merely examples, and can be arbitrarily changed. Further, the semiconductor device 30 shown in each of FIGS. 3 and 6 is a simple microcomputer as a configuration example, and only the functional blocks necessary for explanation are illustrated. However, other functional blocks, for example, an interrupt control circuit, a direct memory access controller, a non-volatile memory, and a clock generation circuit, and peripheral functional blocks such as a timer and a communication interface may be mounted. Further, the CPU 10 can be changed to a processor with arbitrary architecture in such a manner that the memory is hierarchized by including a memory management unit or a cache memory, and the bus is hierarchized, or the CPU 10 is changed to a multiprocessor by mounting plural CPUs 10. On the other hand, the semiconductor device 30 may be configured using a dedicated circuit without mounting a processor such as the CPU 10.

What is claimed is:

1. A correlation operation circuit that calculates a correlation function between sequentially-input time series data and a detection pattern represented by a plurality of pieces of detection pattern data, the correlation operation circuit comprising:
a first memory configured to store the pieces of detection pattern data;
a multiplier;
an adder;
a second memory configured to store intermediate data of a product-sum operation by the multiplier and the adder; and
a comparator,
wherein the multiplier is configured to sequentially multiply one input time series data by the pieces of detection pattern data sequentially read from the first memory, and to sequentially supply the calculated product to one input of the adder,
wherein corresponding intermediate data is read from the second memory to be sequentially supplied to the other input of the adder in synchronization with the multiplication, and the adder is configured to add the product to the corresponding intermediate data to be written back into the second memory as the intermediate data,
wherein data obtained by cumulatively adding the products between all the pieces of detection pattern data and the pieces of time series data as many as the detection pattern data is used as result data, and wherein the comparator is configured to compare the result data with a predetermined specified value.

2. The correlation operation circuit according to claim 1, further comprising an A/D converter, wherein the A/D converter is configured to sequentially convert an analog signal to be input into a digital value, and to supply the digital value to the adder as the time series data.

3. The correlation operation circuit according to claim 1, further comprising a serial/parallel converter, wherein the serial/parallel converter is configured to convert a digital value input as serial data into parallel data, and to supply the parallel data to the multiplier as the time series data.

4. A correlation operation circuit that calculates a correlation function between sequentially-input time series data and a detection pattern represented by N (N is an integer equal to or larger than 2) pieces of detection pattern data, the correlation operation circuit comprising:

a first memory configured to store the N pieces of detection pattern data;

a multiplier;

an adder;

a second memory configured to store intermediate data of a product-sum operation by the multiplier and the adder; and a comparator, wherein the multiplier is configured to sequentially multiply one input time series data by the first to N-th pieces of detection pattern data sequentially read from the first memory, and to sequentially supply the calculated first to N-th products to one input of the adder, wherein a product between the first detection pattern data and the one input time series data is used as a first product, and first intermediate data corresponding to the first product is 0, wherein the other pieces of intermediate data respectively corresponding to the other products are read from the second memory to be sequentially supplied to the other input of the adder in synchronization with the multiplication, and the adder is configured to add the product to the corresponding intermediate data to be written back into the second memory as the intermediate data, wherein data obtained by cumulatively adding the products between all the N pieces of detection pattern data and the N pieces of time series data is used as result data, and wherein the comparator is configured to compare the result data with a predetermined specified value.

5. The correlation operation circuit according to claim 4, further comprising an A/D converter, wherein the A/D converter is configured to sequentially convert an analog signal to be input into a digital value, and to supply the digital value to the multiplier as the time series data.

6. The correlation operation circuit according to claim 4, further comprising a serial/parallel converter, wherein the serial/parallel converter is configured to convert a digital value input as serial data into parallel data, and to supply the parallel data to the multiplier as the time series data.

7. A semiconductor device comprising:

a CPU (Central Processing Unit);

a bus;

an A/D converter; and a correlation operation circuit, wherein the A/D converter is configured to sequentially convert an analog signal to be input into time series data, wherein the CPU is configured to obtain the time series data through the bus, wherein the correlation operation circuit comprises a first memory configured to store a plurality of pieces of detection pattern data, a multiplier, an adder, a second memory configured to store intermediate data of a product-sum operation by the multiplier and the adder, and a comparator, wherein the multiplier is configured to sequentially multiply one input time series data by the pieces of detection pattern data sequentially read from the first memory, and to sequentially supply the calculated product to one input of the adder, wherein corresponding intermediate data is read from the second memory to be sequentially supplied to the other input of the adder in synchronization with the multiplication, and the adder is configured to add the product to the corresponding intermediate data to be written back into the second memory as the intermediate data, wherein data obtained by cumulatively adding the products between all the pieces of detection pattern data and the pieces of time series data as many as the detection pattern data is used as result data, wherein the comparator is configured to compare the result data with a predetermined specified value, and wherein the correlation operation circuit is configured to generate an interrupt request to the CPU when the comparison result exceeds the predetermined specified value.

8. The semiconductor device according to claim 7, further comprising a serial communication interface, wherein the serial communication interface is configured to sequentially convert a serial data signal to be input into parallel data, and to supply the parallel data as the time series data.

* * * * *